(12) United States Patent
Harris et al.

(10) Patent No.: US 7,064,955 B2
(45) Date of Patent: Jun. 20, 2006

(54) REDUNDANT POWER FOR PROCESSOR CIRCUIT BOARD

(75) Inventors: Shaun L. Harris, Mckinney, TX (US); Steven A. Belson, Plano, TX (US); Eric C. Peterson, McKinney, TX (US); Gary W. Williams, Rowlett, TX (US); Christian L. Belady, Mckinney, TX (US); Jeffrey P. Christenson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 66 days.

(21) Appl. No.: 10/996,477

(22) Filed: Nov. 24, 2004

(65) Prior Publication Data
US 2006/0109625 A1    May 25, 2006

(51) Int. Cl.
*H05K 7/20*    (2006.01)

(52) U.S. Cl. ............ 361/695; 361/709; 361/785; 361/692; 257/707; 257/721; 174/260; 165/80.3; 307/44

(58) Field of Classification Search ........ 361/686–689, 361/692–695, 700, 709, 761, 783–791, 772, 361/773, 774, 808–809; 257/706, 707, 713, 257/715, 718–719, 690–697, 721, 735, 737; 174/15.2, 16.1, 16.3, 35 R, 52.1, 59, 60, 174/260, 261; 165/80.2, 80.3, 185; 307/43, 307/44, 64, 65, 112, 116, 125, 139, 140
See application file for complete search history.

(56) References Cited

U.S. PATENT DOCUMENTS

| 5,986,887 | A * | 11/1999 | Smith et al. | 361/704 |
| 6,304,450 | B1 * | 10/2001 | Dibene et al. | 361/704 |
| 6,356,448 | B1 * | 3/2002 | DiBene et al. | 361/721 |
| 6,556,455 | B1 * | 4/2003 | Dibene et al. | 361/785 |
| 6,623,279 | B1 * | 9/2003 | Derian et al. | 439/74 |
| 6,807,058 | B1 * | 10/2004 | Matteson et al. | 361/700 |
| 6,819,562 | B1 * | 11/2004 | Boudreaux et al. | 361/690 |
| 6,979,784 | B1 * | 12/2005 | Duley | 174/260 |
| 7,005,586 | B1 * | 2/2006 | Duley | 174/261 |
| 2002/0176229 | A1 * | 11/2002 | Derian et al. | 361/704 |
| 2003/0162442 | A1 * | 8/2003 | Panella | 439/608 |
| 2003/0198033 | A1 * | 10/2003 | Panella et al. | 361/760 |
| 2005/0078463 | A1 * | 4/2005 | Chheda et al. | 361/789 |

* cited by examiner

*Primary Examiner*—Michael Datskovskiy

(57) ABSTRACT

One embodiment includes an electronic assembly having a first printed circuit board (PCB) and a second PCB. The second PCB has at least one processor coupled to and disposed above the first PCB. A thermal dissipation device is disposed above the second PCB, dissipates heat away from the processor, and provides an airflow path. First and second power systems are coupled to the second PCB and in a pathway of the airflow path. The first and second power systems are redundant such that upon failure of the first power system, the second power system can provide power for both power systems.

20 Claims, 3 Drawing Sheets

REDUNDANT POWER FOR PROCESSOR CIRCUIT BOARD

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

As noted, packing density is one important criterion in many electronic systems. One way to reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

Heat dissipation is also an important criterion in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail.

As processor and memory technologies advance, power distribution architecture concurrently must evolve to meet demands of processors and memories. Designers consider many factors when developing power distribution architectures for electronic systems. For instance, one important consideration is supplying reliable power to processor circuit boards. If a power converter fails, for example, then power to an entire circuit board can be lost.

The design and layout of printed circuit board components can be quite complex and challenging. Designers must consider many important factors, such as packing density, heat dissipation, and power distribution architecture. Improvements in these areas can realize important benefits for electronic systems and devices.

SUMMARY

Embodiments in accordance with the present invention are directed to apparatus, methods, and systems for providing redundant power to processor circuit boards. In one exemplary embodiment, an electronic assembly has a first printed circuit board (PCB) and a second PCB. The second PCB has at least one processor coupled to and disposed above the first PCB. A thermal dissipation device is disposed above the second PCB, dissipates heat away from the processor, and provides an airflow path. First and second power systems are coupled to the second PCB and in a pathway of the airflow path. The first and second power systems are redundant such that upon failure of the first power system, the second power system can provide power for both power systems.

In another exemplary embodiment, a method comprises connecting a first circuit board having plural processors to a second circuit board, such that a space is created between the first and second circuit boards; connecting plural redundant power systems to the first circuit board; and thermally dissipating heat away from both the plural processors and the plural power systems with a single thermal dissipation device.

Other embodiments and variations of these embodiments are shown and taught in the accompanying drawings and detailed description.

DETAILED DESCRIPTION

Figure 1:
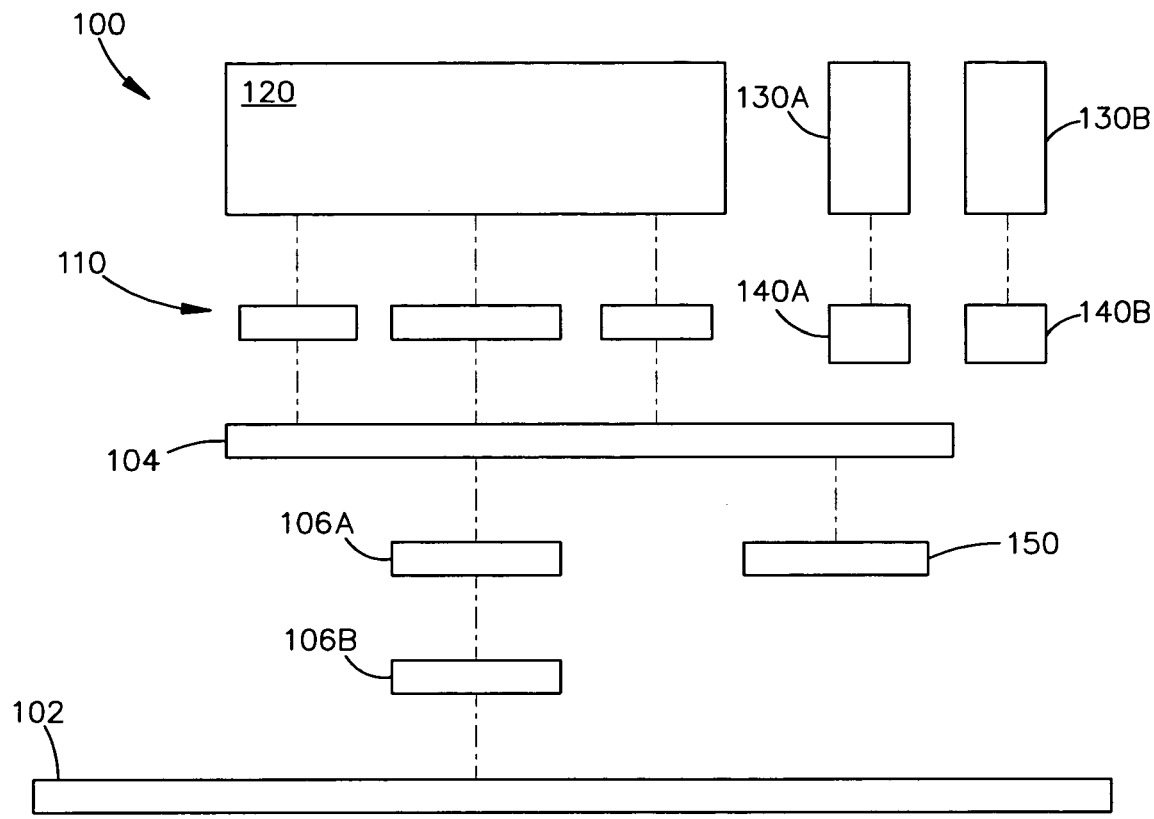
FIG. 1 is an exploded side view of a block diagram of an electronic assembly in accordance with an exemplary embodiment of the present invention.

FIG. 1 is an exploded side view of a block diagram of an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, ICs, modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector can be used to connect the PCBs 102 and 104.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 can also include a plurality of electronic components or device that may or may not generate heat or that may generate low or insignificant amounts of heat. Examples of such devices include, but are not limited to, resistors, capacitors, transistors, diodes, memories, etc.

The electronic assembly 100 can include at least one thermal dissipation device 120. The thermal dissipation device includes, but is not limited to, heat spreaders, cold plates, refrigeration (evaporative cooling) plates, heat pipes, mechanical gap fillers (such as a plurality of pins, rods, etc.), or other devices adapted to dissipate heat. Further, such thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the thermal dissipation device, including heatsinks, can use liquids and/or phase change materials.

Figure 2:
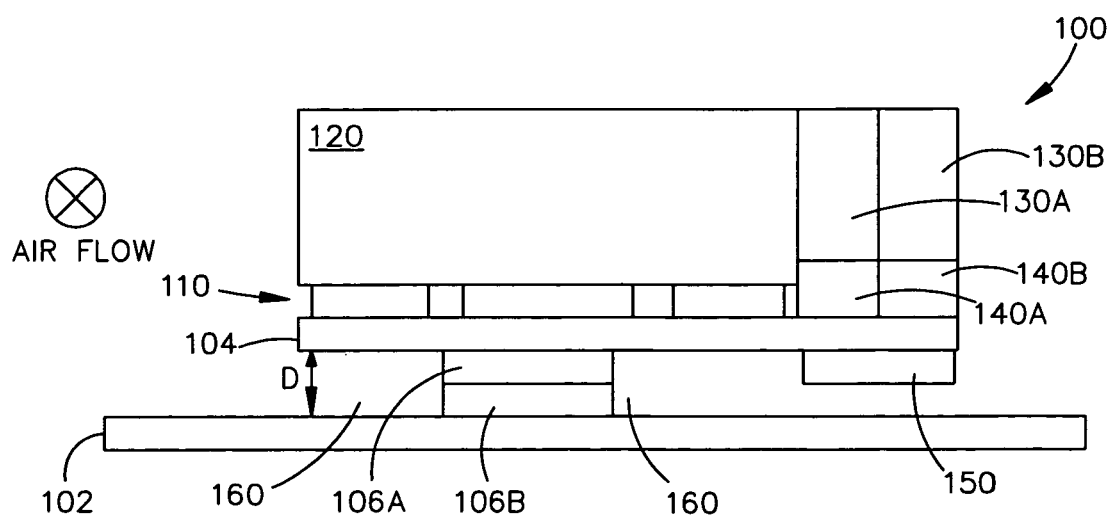
FIG. 2 is a side view of the electronic assembly of FIG. 1 with the electronic assembly being assembled together.

The electronic assembly 100 also includes multiple power supplies or power systems 130A, 130B. An electrical connector or coupling device 140A, 140B connects the respective power system 130A, 130B to the PCB 104. As best shown in FIG. 2, the power systems 130A, 130B are disposed adjacent each other in a horizontally stacked relationship.

The power systems 130A, 130B can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC-DC converter, AC-DC converter, DC linear regulator, DC switching regulator, or DC charge pump.

Looking now to FIGS. 2–5, power distribution architecture, thermal dissipation, and packing density are discussed in more detail for the electronic assembly 100.

The two powers systems 130A, 130B may be redundant power systems. Redundant power systems can serve as a duplicate for preventing failure upon failure of one of the power systems. In other words, if one power system fails, then the other power system can supply sufficient power to the system to continue operation of the system. As an example, if power system 130A fails, then power system 130B could provide sufficient power to the PCB 104 and corresponding heat-generating components 110. Alternatively, if power system 130B fails, then power system 130A could provide sufficient power to the PCB 104 and corresponding heat-generating components 110.

The two power systems 130A, 130B may also be modular and replaceable. In some embodiments, each power system 130A, 130B is an independently-operable unit that can be constructed with standardized units or dimensions for flexibility and replaceability for use in the electronic assembly 100. Further, each power system 130A, 130B can be connected to or removed from the electronic assembly (example, the PCB 104) without connecting, removing, or replacing other components in the electronic assembly 100 (example, the heat-generating components 110). By way of illustration, suppose for example that power system 130B fails or otherwise needs replaced or upgraded. The power system 130B can be disconnected and removed from the PCB 104 without removing or replacing the power system 130A, PCB 104, thermal dissipation device 120, and/or the heat-generating components 110. As another illustration, suppose for example that power system 130A fails or otherwise needs replaced or upgraded. The power system 130A can be disconnected and removed from the PCB 104 without removing or replacing the power system 130B, PCB 104, thermal dissipation device 120, and/or the heat-generating components 110. Further, the power systems can be disconnected and connected independent of each other and support hot-swapping (i.e., the ability to add and remove devices to and from a computer or electronic device while the computer or electronic device is running with the operating system automatically recognizing the changed or newly added component).

Figure 3:
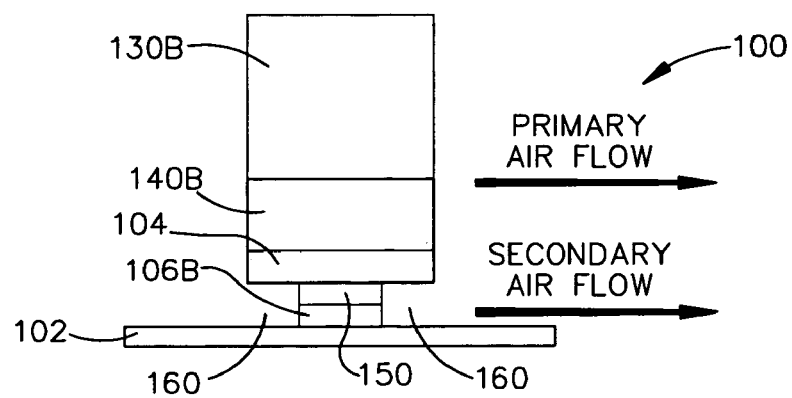
FIG. 3 is an end view of FIG. 2.
Figure 4:
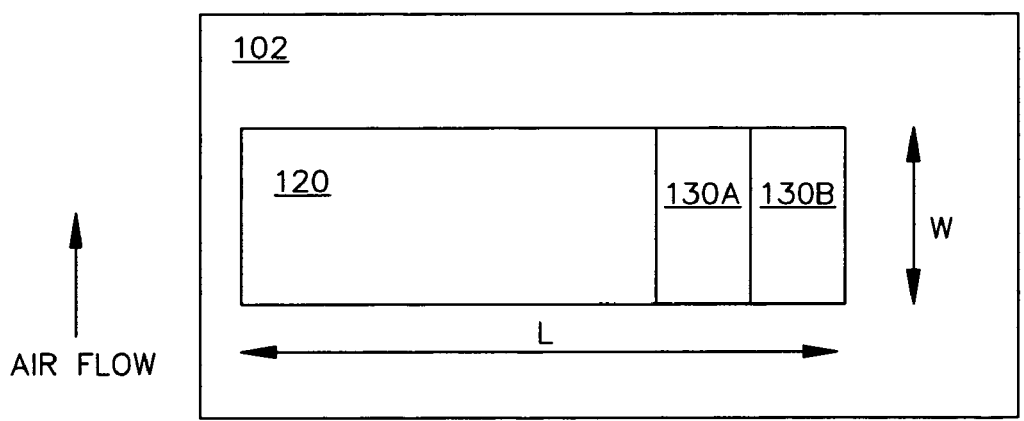
FIG. 4 is a top view of FIG. 2.
Figure 5:
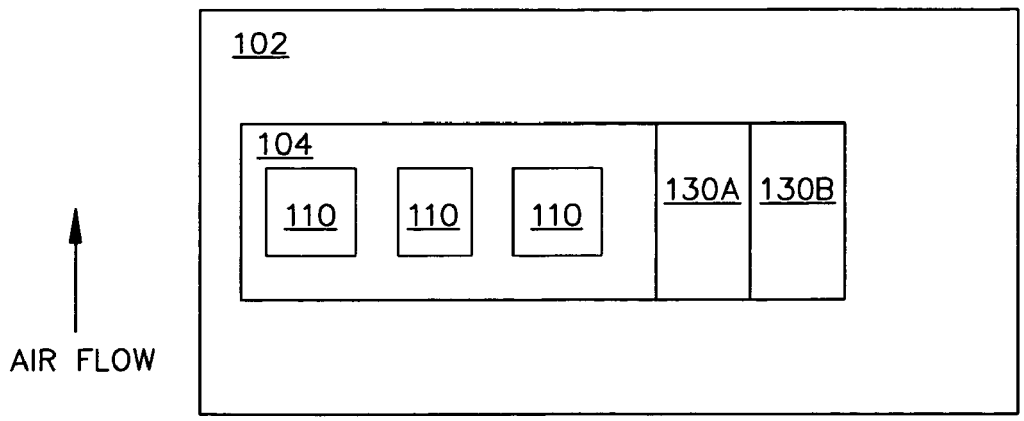
FIG. 5 is a top view of the FIG. 2 with the thermal dissipation device removed from the electronic assembly.

Once connected, the PCB 102 is generally parallel to the PCB 104. The PCBs 102 and 104 are mechanically and electrically connected to form a vertical stacked-up configuration. In particular, the connectors 106A and 106B couple the PCBs together. The PCB 102 is separated from the PCB 104 by a distance "D" (see FIG. 2) that is equal to or approximately equal to the height or thickness of the connectors. 106A and 106B when connected together. Further, as best shown in FIG. 4, the PCB 104 can be defined to have a surface area equal to length "L" multiplied by width "W." As best shown in FIGS. 2 and 3, a volume of unused or empty space 160 exists between the PCB 102 and the PCB 104 when they are in a stacked-up configuration. The volume of unused or empty space 160 is generally equal to or approximately equal to the amount of space under the PCB 104 minus such space occupied by the connectors 106A and 106B. In other words, the amount of unused space 160 equals (L×W×D) minus (volume of connectors 106A/106B).

In one exemplary embodiment, both power systems 130A and 130B are in the direct pathway of airflow created by the thermal dissipation device 120. The airflow pathway directed onto the power systems 130A, 130B can provide sufficient cooling so that the power systems do not require additional cooling or additional cooling devices in order to operate properly or within a specified or normal temperature range. As such, the power systems 130A, 130B are not required to be directly below the thermal dissipation device 120 or in direct or indirect heat exchange with a thermal dissipation device. For example as best shown in FIG. 2, the power systems are adjacent to an end or side of the thermal dissipation device 120. The thermal dissipation device, 120, however, does not extend above or over the power systems 130A, 130B. As such, the configuration or arrangement of electronic components shown in the figures saves weight, space, and money since an additional thermal dissipation device or thermal dissipation material over the power systems 130A, 130B is not necessary.

In another exemplary embodiment, one or both of the power systems 130A and 130B can be cooled via direct heat exchange with the thermal dissipation device 120. Looking to FIGS. 1 and 2 for example, heat can conduct or flow from power system 130B to power system 130A and then to thermal dissipation device 120. The heat from the power systems can then be evacuated or dissipated from the thermal dissipation 120.

Although the thermal dissipation device 120 is shown adjacent the power system 130A, numerous other embodiments are within the scope of the invention. For example, the thermal dissipation device 120 can extend around, at, above, or below any one or numerous surfaces of the power systems 130A and 130B. For instance, a portion of the thermal dissipation device 120 can extend above the power systems. Further yet, an additional thermal dissipation device, such as a heat spreader, can be positioned directly above the power systems 130A, 130B to evacuate or dissipate heat away from the power systems.

In another exemplary embodiment, one or both of the power systems 130A and 130B can be cooled via both (1) direct heat exchange with the thermal dissipation device 120 and (2) an airflow created by the thermal dissipation device 120. As such, the thermal dissipation device 120 simultaneously cools or dissipates heat for both power systems 130A, 130B and heat-generating components 110 on the PCB 104. In one exemplary embodiment, the thermal dissipation device 120 can, via direct or indirect heat exchange, dissipate heat from the heat-generating components 110 located directly below the thermal dissipation device 120.

In order to further increase the packing density or increase an effective use of space in the electronic assembly 100, the unused space 160 can be occupied with electronic components. Such electronic components can include heat-generating or non-heat-generating devices. Preferably, these components include non-heat-generating devices or low heat-generating devices, such as electronic components that do not require the use of a thermal dissipating device to operate properly. As best shown in FIG. 2, the unused space 160 can include the electronic components 150. These components 150 can include electronic components or elements associated with the power systems 130A, 130B. By way of example only, these components 150 include, but are not limited to, pulse width modulation (PWM) devices, switches, bit tests (such as testing the value of specific bits in memory or registers), and bus architecture (such as I²C buses).

As best shown in FIGS. 2–5, the thermal dissipation device 120 is positioned directly above the heat-generating components 110 of the PCB 104. Further, as best shown in FIGS. 2 and 3, the power systems 130A, 130B are positioned adjacent to the thermal dissipation device 120 and directly above the PCB 104. As shown in FIG. 2, the power systems 130A, 130B connect directly, via connectors 140A, 140B, to the PCB 104.

For purposes of illustration only, the electronic assembly 100 is shown with an airflow direction as indicated with arrows in FIGS. 2–5 (the airflow being into the page and indicated with a circle and "X" in FIG. 2). The airflow can be provided, for example, with a fan or other device positioned within the electronic assembly 100 or within the thermal dissipation device 120. The airflow is directed in a pathway that is parallel to the PCBs 102 and 104. A primary airflow (shown in FIG. 3) is directed at and/or above the PCB 104. This primary airflow is directed at the thermal dissipating device 120, the power systems 130A, 130B, and the heat-generating components 110. Thus, the same airflow can be used to cool or dissipate heat simultaneously from the thermal dissipating device 120, the power systems 130A, 130B, and heat-generating components 110.

As shown in FIG. 3, the airflow can include a secondary airflow. This secondary airflow is much weaker than the primary airflow. In other words, the volumetric airflow rate (cubic feet per minute, CFM) is less in the secondary airflow than in the primary airflow.

The secondary airflow passes between the PCB 102 and the PCB 104. In particular, the secondary airflow passes through the empty space 160. Preferably, non-heat-generating or low heat-generating devices are placed in the empty space and, thus, in the pathway of the secondary airflow. As shown in FIGS. 2 and 3, components 150 are placed in the empty space 160 since these components 150 do not require assistance of the thermal dissipating device 120 to operate properly.

Figure 6:
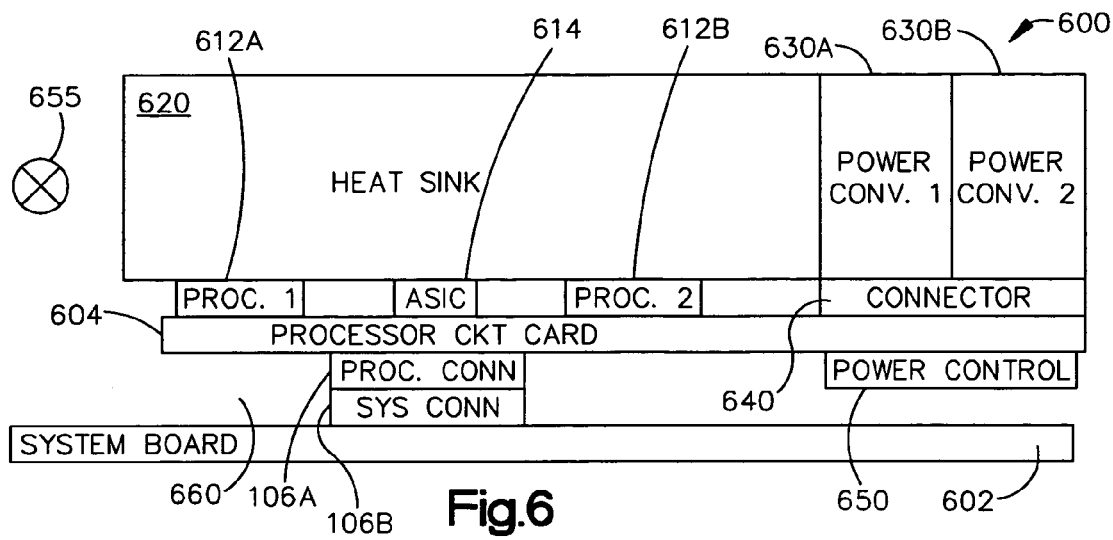
FIG. 6 is a side view of an exemplary embodiment of an electronic assembly.

Various different electronic components and PCBs can be combined into embodiments in accordance with the invention. FIG. 6 illustrates one such exemplary embodiment as electronic assembly 600. In this figure, a system board 602 connects to a processor circuit card 604 with a processor connector 106A and a system connector 106B. The processor circuit card 604 includes a plurality of processors and ASICs. For example, the processor circuit card 604 can have two processors 612A and 612B and an ASIC 614. A heatsink 620 is positioned directly above the processor circuit card 604 to cool and dissipate heat, via direct heat exchange, for the processors 612A, 612B and ASIC 614. Two power converters 630A, 630B are positioned adjacent the heatsink 620 and above the processor circuit card 604. An electrical connector 640 couples or connects the two power converters 630A, 630B to the processor circuit card 604. A power control 650 extends in unused space 660 and mechanically and electrically couples to the processor circuit card 604. The power control 650 can, for example, provide power control functionality for the power converters 630A, 630B.

As shown, the power converters 630A, 630B are adjacent the heatsink 620 and above the processor circuit card 604 so as to be in a direct airflow pathway 655 of the heatsink 620. As such, the heatsink 620 simultaneously cools or dissipates heat for both the heat-generating components on the processor circuit card 604 (example, the processors 612A, 612B and ASIC 614) and the power converters 630A, 630B.

The electronic assembly 600 includes space 660 between the processor circuit card 604 and the system board 602. This space 660 is at least partially occupied with the power control 650 to increase packing density or packing efficiency for the electronic assembly 600.

Figure 7:
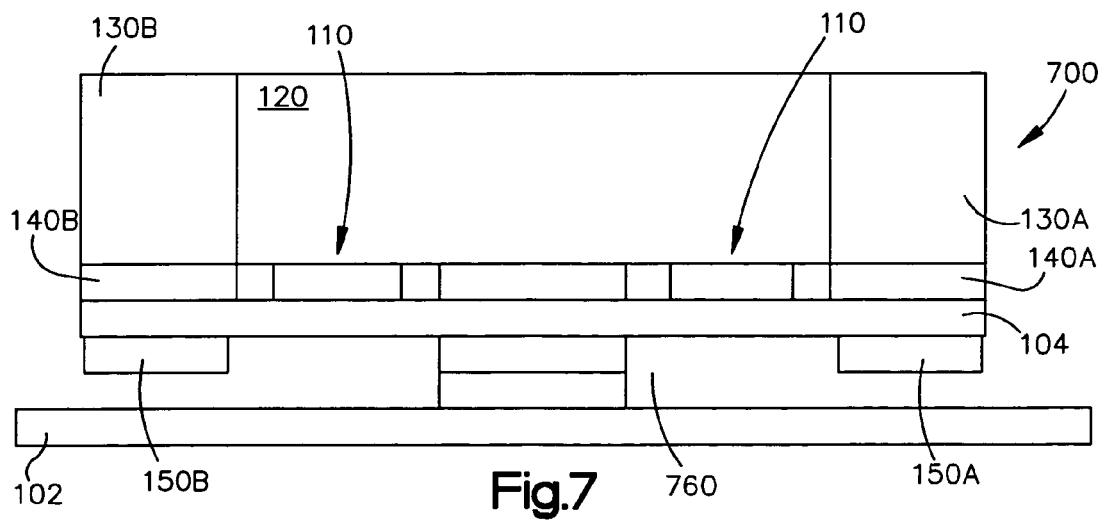
FIG. 7 is a side view of another exemplary embodiment of an electronic assembly.

FIG. 7 shows another exemplary electronic assembly 700 in accordance with an embodiment of the present invention. The electronic assembly 700 is generally similar to the electronic assembly 100 shown in FIGS. 2–5, and like reference numerals are used in FIG. 7. As one difference, the electronic assembly 700 includes a power system 130A, a connector 140A, and an electronic component 150A located at a first end or side of the PCB 104. Another power system 130B, connector 140B, and electronic component 150B are located a second end or side of the PCB 104. As shown, the first and second sides are at opposite ends of the PCB 104. Further, the power system 130A is adjacent a first end of the thermal dissipation device 120, and the power system 130B is adjacent a second opposite end of the thermal dissipation device 120.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

Embodiments in accordance with the present invention can utilize a variety of modules. As an example, looking to FIG. 2, the PCB 104 can be a processor module that includes heat-generating components 110 (such as two separate processors, an ASIC, and memory all on the same board or card). As another example, the two separate power systems 130A, 130B could connect together via connectors, such as one or both of connectors 140A, 140B. Once connected, the two power systems 130A, 130B can form a power module. As yet another example, the processor module and power system module can be connected together to form a power/processor module. The thermal dissipation device 120 can be connected to the processor module and/or the power system module. FIG. 2, for example, shows such a module connected, via connectors 106A and 106B, to PCB 102. This module can be removably connected to the PCB 102.

Embodiments in accordance with the present invention can utilize a modular connective architecture. If a particular electronic component (including PCBs) or device fails or otherwise needs to be replaced, the electronic component can be removed from the electronic assembly and replaced with a new and/or different component. As such, the electronic assemblies can be constructed with standardized electronic components and/or dimensions to enable flexibility and variety of use and exchange of components. Looking to FIG. 7 as an example, if power system 130A fails or needs to be replaced, the power system 130A can be disconnected or uncoupled from the connector 140A and removed from the electronic assembly 100 while the PCB 104 remains mechanically connected to the PCB 102. A new and/or different power assembly can thereafter be connected to the connector 140A and utilized with the electronic assembly 100.

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

Embodiments in accordance with the invention are not limited to two power systems or a single PCB 104. For example, plural power systems can be stacked or arranged on a single PCB. Further, plural PCBs can be stacked on arranged on each other or on another PCB. For example, the PCB 102 can include plural PCBs 104 stacked or arranged on PCB 102.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural processors, ASICs, and other devices. The first circuit board can be connected to a second circuit board in a vertical stacked-up configuration to create a space between the first and second circuit boards. Plural power systems can be connected to the first circuit board. One or more connectors can couple the power systems to the first circuit board. One or more of the power systems can also be coupled to electronic components, such as control components associated with the power systems. These electronic components can at least partially extend into the space between the first and second circuit boards. A thermal dissipation device can thermally dissipate heat away from both heat-generating devices and the power systems. Further, the thermal dissipation device can generate at least a primary airflow path that is directed toward both the thermal dissipation device and the power systems. A second airflow path can also be generated. This second airflow path can be directed through the space and toward a portion of the power system that extends into the space. The space can be filled with electronic components to increase the packing density of the electronic assembly. In one exemplary embodiment, these electronic components can be low or non-heat-generating components.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic assembly, comprising:
   a first printed circuit board (PCB);
   a second PCB having at least one processor, the second PCB being coupled to and disposed above the first PCB;
   a thermal dissipation device connected to and disposed above the second PCB, dissipating heat away from the processor, and providing an airflow path; and
   first and second power systems providing power to the second PCB and in a pathway of the airflow path, the first and second power systems being redundant such that upon failure of the first power system, the second power system can provide power for both power systems to the second PCB.

2. The electronic assembly of claim 1 wherein the first and second power systems are stacked next to each other above the second PCB.

3. The electronic assembly of claim 1 wherein the first and second power systems are adjacent, but not beneath, the thermal dissipation device.

4. The electronic assembly of claim 1 wherein the first and second power systems are a module that is removable from and connectable to the second PCB while the first and second PCBs remain connected.

5. The electronic assembly of claim 1 further comprising a controller for the first and second power systems, wherein the controller is disposed underneath the second PCB and between the first and second PCBs.

6. The electronic assembly of claim 1 wherein the first power system is located at a first side of the thermal dissipation device, the second power system is located at a second side of the thermal dissipation device, and the first and second sides are opposite each other.

7. The electronic assembly of claim 1 wherein the airflow path provides sufficient heat dissipation for the first and second power systems such that additional heat dissipating devices are not required for the first and second power systems to operate in a normal temperature range.

8. A method, comprising:
   providing a first circuit board having plural separate processors;
   connecting plural separate redundant power systems and a single thermal dissipation device to the first circuit board to form a multi-processor module;

connecting the multi-processor module to a second circuit board, such that a space is created between the first and second circuit boards; and thermally dissipating heat away from both the plural processors and the plural power systems with the single thermal dissipation device.

9. The method of claim 8 further comprising providing sufficient power to the first circuit board from one single power system upon failure of a second power system.

10. The method of claim 8 further comprising:

dissipating heat from the plural power systems with an airflow generated by the thermal dissipation device;

dissipating heat from the plural processors with heat exchange from the processors to the thermal dissipation device.

11. The method of claim 8 further comprising filling the space with electronic components associated with operation of the plural power systems.

12. The method of claim 8 further comprising:

positioning the power systems adjacent, but not below, the thermal dissipation device and above the first circuit board;

positioning the plural processors below the thermal dissipation device and above the first circuit board.

13. The method of claim 8 further comprising:

connecting power control components to at least one power system; and extending the power control components under the first circuit board into the space.

14. The method of claim 8 further comprising:

disconnecting at least one power system from the first circuit board without disconnecting the first circuit board from, the second circuit board;

connecting a different power system to the first circuit board to replace the at least one power system.

15. An apparatus, comprising:

first and second printed circuit boards (PCBs) coupled in a vertically stacked relationship to create a space therebetween and having plural heat-generating components requiring assistance with heat dissipation;

at least two redundant power systems coupled to at least one of the first and second PCBs, wherein each power system serves as a duplicate for preventing failure upon failure of one of the power systems; and a thermal dissipation device for dissipating heat, via an airflow, away from the two power systems and for dissipating heat, via heat exchange, away from the plural heat-generating components.

16. The apparatus of claim 15 wherein:

the space is approximately equal to a surface area of the first PCB times a distance between the first and second PCBs;

a portion of the two power systems extends into the space.

17. The apparatus of claim 15 wherein:

the plural heat-generating components include two processors disposed on the first PCB;

the two power systems are arranged in a horizontal stacked relationship coupled to the first PCB.

18. The apparatus of claim 15 further comprising a plurality of electronic devices disposed in the space, the electronic devices generating less heat than the plural heat-generating devices.

19. The apparatus of claim 15 wherein the two power systems can be uncoupled from and coupled to one of the PCBs while the first and second PCBs remain coupled in the vertically stacked relationship.

20. The apparatus of claim 15 wherein the thermal dissipation device generates an airflow toward the two power systems and toward the plural heat-generating components.

* * * * *

UNITED STATES PATENT AND TRADEMARK OFFICE
CERTIFICATE OF CORRECTION

PATENT NO.        : 7,064,955 B2
APPLICATION NO.   : 10/996477
DATED             : June 20, 2006
INVENTOR(S)       : Shaun L. Harris et al.

Page 1 of 1

It is certified that error appears in the above-identified patent and that said Letters Patent is hereby corrected as shown below:

In column 9, line 34, in Claim 14, after "from" delete ",".

Signed and Sealed this

Third Day of March, 2009

JOHN DOLL
*Acting Director of the United States Patent and Trademark Office*